United States Patent
Cheng et al.

(10) Patent No.: US 10,902,910 B2
(45) Date of Patent: Jan. 26, 2021

(54) PHASE CHANGE MEMORY (PCM) WITH GRADUAL RESET CHARACTERISTICS

(71) Applicant: International Business Machines Corporation, Armonk, NY (US)

(72) Inventors: Kangguo Cheng, Schenectady, NY (US); Xin Miao, Slingerlands, NY (US); Chen Zhang, Guilderland, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/452,429

(22) Filed: Jun. 25, 2019

(65) Prior Publication Data
US 2020/0411087 A1 Dec. 31, 2020

(51) Int. Cl.
*G11C 13/00* (2006.01)
*G11C 7/18* (2006.01)
*H01L 45/00* (2006.01)
*G11C 8/14* (2006.01)

(52) U.S. Cl.
CPC .......... *G11C 13/0004* (2013.01); *G11C 7/18* (2013.01); *G11C 8/14* (2013.01); *G11C 13/0097* (2013.01); *H01L 45/06* (2013.01); *H01L 45/144* (2013.01); *H01L 45/16* (2013.01)

(58) Field of Classification Search
CPC ......... G11C 13/0004; G11C 8/14; G11C 7/18; G11C 13/0097; H01L 45/16; H01L 45/144; H01L 45/06
See application file for complete search history.

(56) References Cited

U.S. PATENT DOCUMENTS

| | | | |
|---|---|---|---|
| 7,042,001 B2 | 5/2006 | Kim et al. | |
| 7,545,668 B2 | 6/2009 | Philipp et al. | |
| 7,786,461 B2 | 8/2010 | Lung | |
| 7,902,536 B2 | 3/2011 | Czubatyj et al. | |
| 8,189,374 B2 | 5/2012 | Zaidi | |

(Continued)

FOREIGN PATENT DOCUMENTS

WO WO2016067139 A1 5/2016

OTHER PUBLICATIONS

Raoux et al., "Phase change materials and phase change memory," MRS Bulletin, vol. 39, pp. 703-710 (Aug. 2014).

(Continued)

*Primary Examiner* — David Lam
(74) *Attorney, Agent, or Firm* — Randall Bluestone; Michael J. Chang, LLC (57) ABSTRACT

The present invention provides PCM devices with gradual SET and RESET characteristics. In one aspect, a method of forming a PCM computing device includes: forming word lines and an insulating hardmask cap on a substrate; forming a PCM material over the word lines, having a tapered thickness; and forming bit lines over the PCM material, the insulating hardmask cap, and the word lines, wherein the tapered thickness of the PCM material varies gradually between the word lines and the bit lines. The tapered thickness can be formed by depositing a non-conformal layer of the PCM material or by depositing a conformal layer and then tapering the PCM material using a directional etch. A PCM device is also provided.

22 Claims, 8 Drawing Sheets

(56) References Cited

U.S. PATENT DOCUMENTS

| | | | |
|---|---|---|---|
| 2009/0206318 A1* | 8/2009 | Ko | ..................... H01L 27/2436 |
| | | | 257/4 |
| 2013/0306929 A1 | 11/2013 | Lee et al. | |
| 2015/0006455 A1 | 1/2015 | Suri et al. | |
| 2016/0267378 A1 | 9/2016 | Eleftheriou et al. | |
| 2016/0379110 A1 | 12/2016 | Eleftheriou et al. | |
| 2019/0013359 A1* | 1/2019 | Sciarrillo | ............ H01L 27/2454 |

OTHER PUBLICATIONS

Daniel Krebs et al., "Threshold field of phase change memory materials measured using phase change bridge devices," Applied Physics Letters, vol. 95, No. 8, Aug. 2009, 082101, 3 pp.

* cited by examiner

$G_{total} = G1 + G2 + \ldots + Gn$

(follow from FIG. 8)

PHASE CHANGE MEMORY (PCM) WITH GRADUAL RESET CHARACTERISTICS

FIELD OF THE INVENTION

The present invention relates to phase change memory (PCM) devices, and more particularly, to PCM devices with gradual SET and RESET characteristics.

BACKGROUND OF THE INVENTION

Phase change memory (PCM) has emerged as a viable memory technology. PCM is a non-volatile memory that stores data based on the different conductance states of a phase change material, e.g., crystalline versus amorphous.

For some applications (e.g., analog computing or neuromorphic applications), it is desirable to have the conductance of the PCM change gradually instead of abruptly. However, while the conductance of conventional PCM devices during the SET operation changes gradually, the conductance drops abruptly during the RESET operation. In analog computing the conductance of the PCM devices needs to be increased and decreased regularly. It is highly desired to have a symmetric change of conductance during SET and RESET operation. The asymmetric change of conductance of conventional PCM devices (gradual conductance change during SET and abrupt change of conductance during RESET) thus poses an issue for using PCM in analog computing.

Therefore, PCM having a gradual conductance change for both the SET and RESET operations would be desirable.

SUMMARY OF THE INVENTION

The present invention provides phase change memory (PCM) devices with gradual SET and RESET characteristics. In one aspect of the invention, a method of forming a PCM computing device is provided. The method includes: forming word lines on a substrate, the word lines having an insulating hardmask cap disposed thereon; forming a PCM material over the word lines, wherein the PCM material has a tapered thickness along sidewalls of the word lines; and forming bit lines over the PCM material, the insulating hardmask cap, and the word lines, wherein the bit lines are oriented orthogonal to the word lines, and wherein the tapered thickness of the PCM material varies gradually between the word lines and the bit lines.

In another aspect of the invention, another method of forming a PCM computing device is provided. The method includes: forming word lines on a substrate, the word lines having an insulating hardmask cap disposed thereon; depositing a non-conformal layer of a PCM material onto the substrate over the word lines and the insulating hardmask cap having a tapered thickness along sidewalls of the word lines; removing the PCM material over the insulating hardmask cap; and forming bit lines over the PCM material, the insulating hardmask cap, and the word lines, wherein the bit lines are oriented orthogonal to the word lines, and wherein the tapered thickness of the PCM material varies gradually between the word lines and the bit lines.

In yet another aspect of the invention, yet another method of forming a PCM computing device is provided. The method includes: forming word lines on a substrate, the word lines having an insulating hardmask cap disposed thereon; depositing a conformal layer of a PCM material onto the substrate over the word lines and the insulating hardmask cap; tapering the PCM material along sidewalls of the word lines using a directional etch; and forming bit lines over the PCM material, the insulating hardmask cap, and the word lines, wherein the bit lines are oriented orthogonal to the word lines, and wherein the tapered thickness of the PCM material varies gradually between the word lines and the bit lines.

In still yet another aspect of the invention, a PCM device is provided. The PCM device includes: a substrate; word lines disposed on the substrate; an insulating hardmask cap disposed on the word lines; a PCM material disposed over the word lines, wherein the PCM material has a tapered thickness along sidewalls of the word lines; and bit lines disposed over the PCM material, the insulating hardmask cap, and the word lines, wherein the bit lines are oriented orthogonal to the word lines, and wherein the tapered thickness of the PCM material varies gradually between the word lines and the bit lines.

A more complete understanding of the present invention, as well as further features and advantages of the present invention, will be obtained by reference to the following detailed description and drawings.

DETAILED DESCRIPTION OF PREFERRED EMBODIMENTS

A phase change memory (PCM) material can be switched from a high-resistance state where the material is amorphous, to a low-resistance state where the material is crystalline by the application of voltage or current pulses that heat the material above the crystallization temperature. Conversely, voltage or current pulses can be used to switch the material from the crystalline state back to amorphous state by enabling melt-quenching such that the material solidifies in the amorphous state. See, for example, Raoux et al., "Phase change materials and phase change memory," MRS Bulletin, volume 39, pp. 703-710 (August 2014) (hereinafter "Raoux"), the contents of which are incorporated by reference as if fully set forth herein. These operations are referred to herein as SET and RESET, respectively. PCM stores data based on the high and low conductance of these amorphous versus crystalline states.

Figure 1:
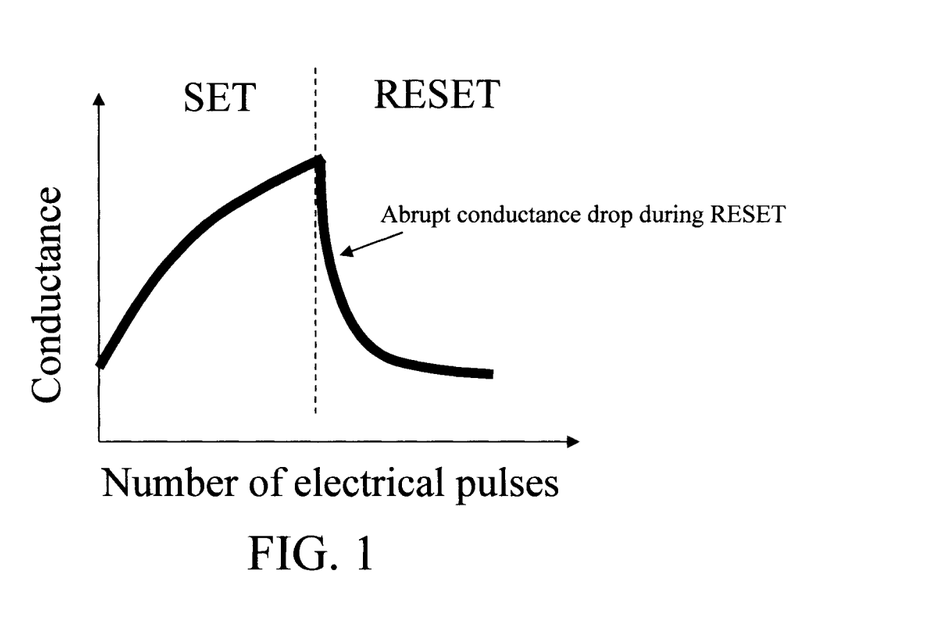
FIG. 1 is a diagram illustrating the switching operation of a conventional phase change memory (PCM)

With conventional PCM designs the conductance changes gradually during the SET operation. However, the conductance drops abruptly during the RESET operation, which is undesirable for analog computing operations. See, for example, FIG. 1 depicting the switching operation of a conventional PCM. As shown in FIG. 1, the conductance increases gradually during the SET operation based on the application of electrical pulses. However, there is an abrupt conductance drop during RESET, i.e., exhibiting asymmetric SET and RESET operations. See FIG. 1. As provided above, the RESET operation involves rapid melt-quenching thereby enabling the PCM material to solidify in the amorphous state. Typically, this change occurs abruptly throughout the entire material, resulting in the switching characteristics illustrated in FIG. 1.

Figure 2:
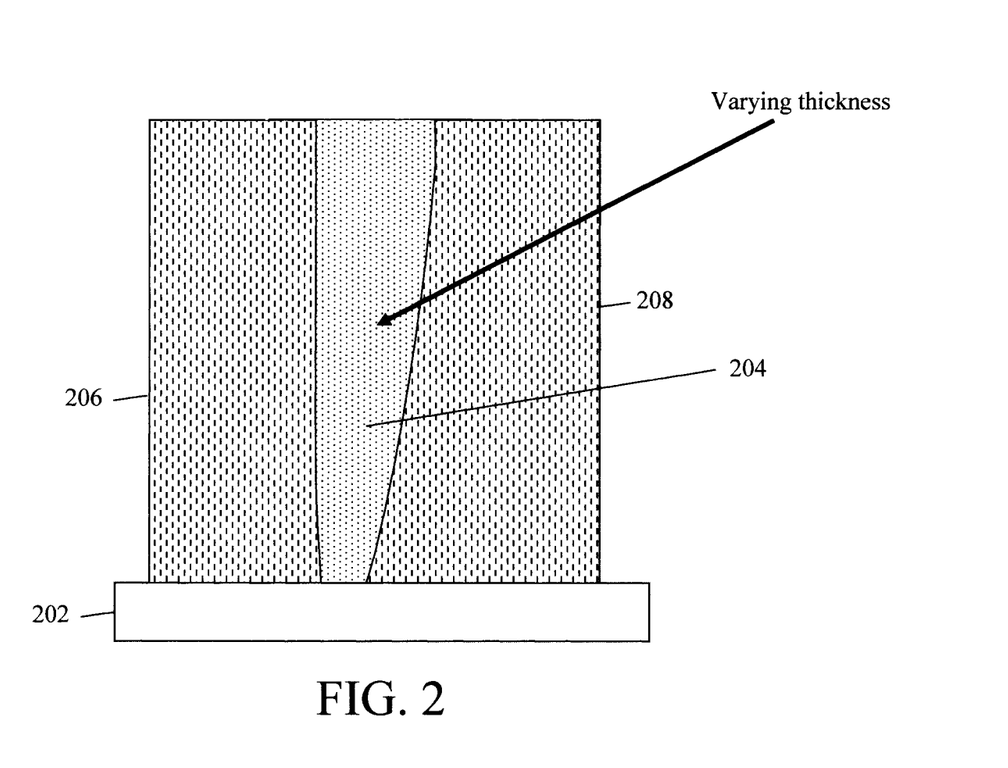
FIG. 2 is a cross-sectional diagram illustrating a PCM material having a thickness that varies gradually between an anode and a cathode according to an embodiment of the present invention.

However, it has been found herein that employing a PCM material with a thickness that varies gradually between an anode and a cathode advantageously avoids the abrupt RESET of the entire PCM layer. See, for example, FIG. 2. As shown in FIG. 2, a PCM in accordance with the present techniques includes a PCM material 204 between an anode 206 and a cathode 208 on a substrate 202. The PCM material 204 has a thickness that varies gradually between the anode 206 and cathode 208. For instance, in the example depicted in FIG. 2, the thinnest portion of PCM material 204 is at the bottom, and the thickness gradually increases moving toward the top of PCM material 204.

Because the RESET of PCM material 204 (crystalline state to amorphous state) depends on the electrical field, when a series of electric pulses are applied across PCM material 204 the thinnest portion of the PCM material 204 RESETs first. Based on the gradual thickness gradient of PCM material 204, the RESET operation gradually propagates to the thicker portions of PCM material 204 thereby avoiding the abrupt RESET of the entire PCM layer.

Figure 3:
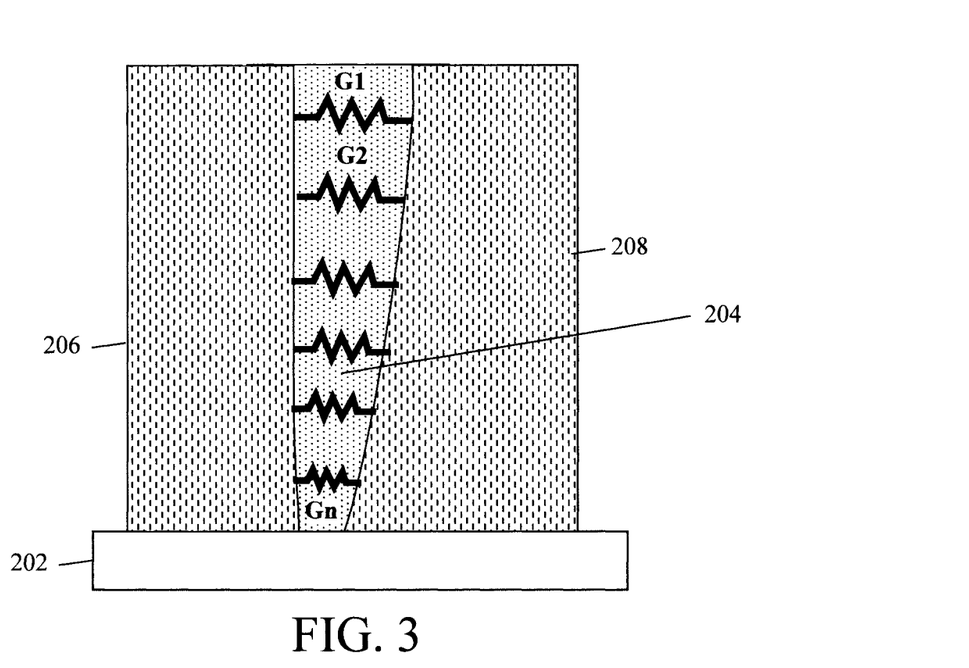
FIG. 3 is a cross-sectional diagram illustrating how the present PCM material can be viewed as multiple, individual PCMs with different thicknesses in parallel according to an embodiment of the present invention.
Figure 4:
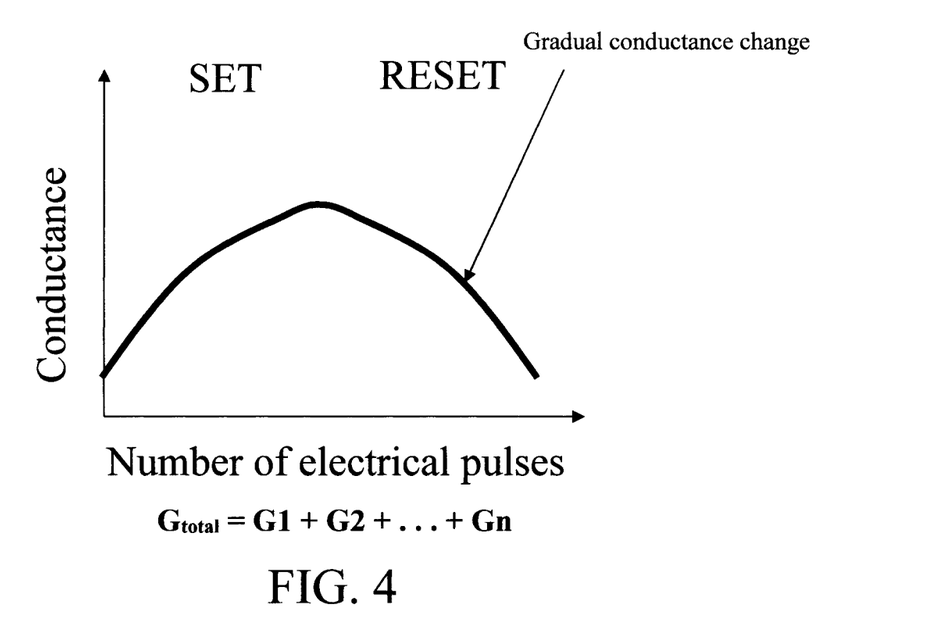
FIG. 4 is a diagram illustrating that the gradual switching of the individual PCMs results in a gradual conductance change during the RESET operation of the present PCM according to an embodiment of the present invention.

Electrically, the present PCM material 204 can be viewed as multiple, individual PCMs with different thicknesses in parallel. See, for example, FIG. 3. As shown in FIG. 3, the total conductance ($G_{total}$) of PCM material 204 is the sum of the conductance (G1, G2, . . . , Gn) of each individual PCM. Because of their different thicknesses, the individual PCMs do not all switch at the same time, thereby avoiding the abrupt conductance drop during RESET. See, for example, FIG. 4. As shown in FIG. 4, the gradual switching of the individual PCMs results in a gradual conductance change during the RESET operation of the present PCM.

Figure 5:
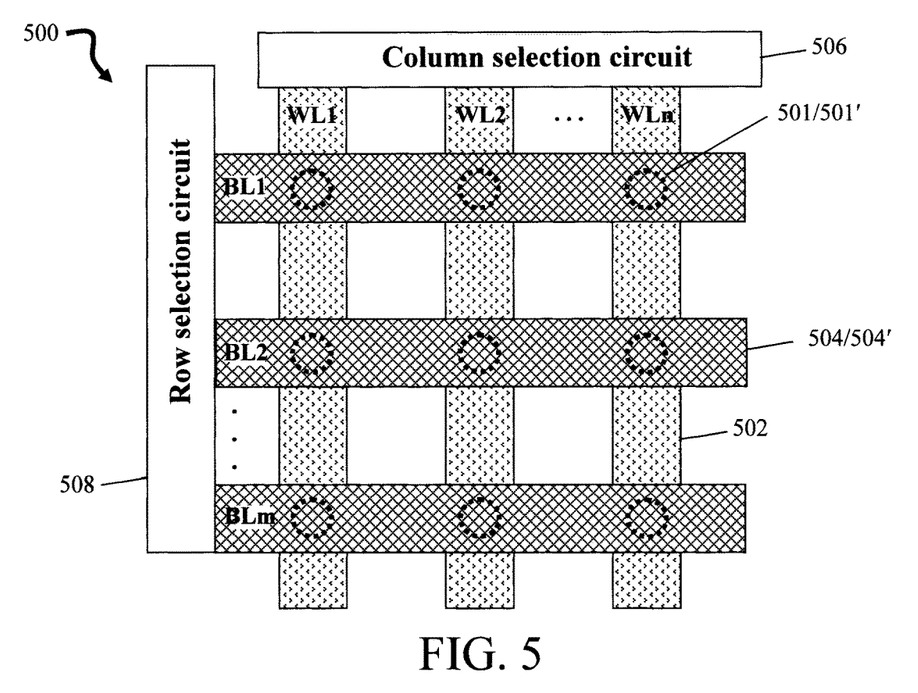
FIG. 5 is a top-down diagram illustrating an exemplary computing device having word lines oriented orthogonal to bit lines, and a single PCM element at each intersection of the word lines and bit lines according to an embodiment of the present invention.

According to an exemplary embodiment, the present PCM design is implemented in a plurality of PCM elements arranged in cross-point array having a plurality of word lines (e.g., WL1, WL2, . . . , WLn) oriented orthogonal to a plurality of bit lines (e.g., BL1, BL2, . . . , BLm), and a PCM element at each intersection of the word lines and bit lines. See, for example, computing device 500 of FIG. 5. As shown in FIG. 5, computing device 500 includes word lines (WL) 502 oriented orthogonal to bit lines (BL) 504 forming a series of columns and rows, respectively. The word lines 502 and bit lines 504 run below and above (or vice versa) PCM elements 501/501' such that a single PCM element 501/501' is present at each intersection of the word lines 502 and bit lines 504/504'. This enables the programming of individual PCM elements 501/501' by the selection of the corresponding column and row via column selection circuit 506 and row selection circuit 508, respectively. Notably, the designations 501 and 501' refer to the PCM elements created using non-conformal PCM deposition or directional etching to form a spacer-like PCM layer, respectively (see below), each of which is represented generically by the circles in FIG. 5. Further, the designations 504 and 504' are used to refer to the bit lines in these non-conformal PCM deposition/directional etching embodiments, respectively, each of which is represented generically by BL1, BL2, . . . , BLm in FIG. 5.

Figure 6:
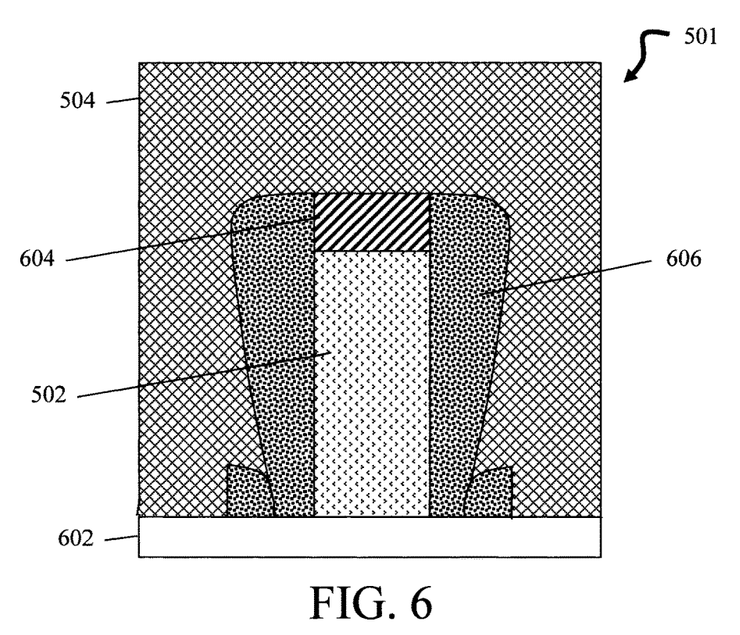
FIG. 6 is a cross-sectional diagram illustrating an individual PCM element from FIG. 5 having a PCM material with a thickness that varies gradually between the word line and bit line which enables a gradual RESET operation that begins with the thinnest portion of the PCM material and gradually propagates to the thicker portions of PCM material thereby avoiding the abrupt RESET of the entire PCM layer according to an embodiment of the present invention.

An exemplary configuration of an individual PCM element 501 is shown in cross-section in FIG. 6. For instance, as shown in FIG. 6 PCM element 501, formed on a substrate 602, is present between a word line (WL) 502 and a bit line (BL) 504. An insulating hardmask cap 604 is disposed on the word line 502 to prevent direct shorting between the word line 502 and bit line 504. As shown in FIG. 6, PCM material 606 has a thickness that varies gradually between the word line 502 (i.e., anode) and bit line 504 (i.e., cathode) which, as described above, enables a gradual RESET operation that begins with the thinnest portion of the PCM material 606 and gradually propagates to the thicker portions of PCM material 606 thereby avoiding the abrupt RESET of the entire PCM layer. It is notable that PCM element 501 is merely one configuration contemplated herein for the PCM element design. For instance, an exemplary embodiment will be described in detail below where conformal PCM material deposition is employed followed by a directional etch to form a spacer-like PCM layer having the opposite thickness taper, i.e., thicker at the bottom.

Figure 7:
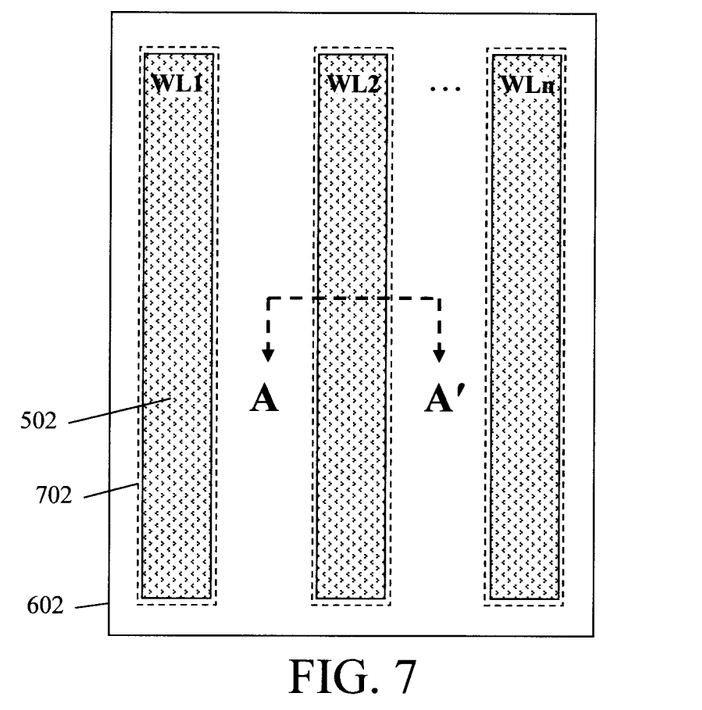
FIG. 7 is a top-down diagram illustrating the word lines having been formed on a substrate with an insulating hardmask cap disposed on the word lines according to an exemplary according to an embodiment of the present invention.

An exemplary methodology for forming computing device 500 is now described by way of reference to FIGS. 7-13. As shown in FIG. 7, a top-down view, the process begins with the formation of word lines 502 on substrate 602. According to an exemplary embodiment, substrate 602 is a bulk semiconductor wafer, such as a bulk silicon (Si), bulk germanium (Ge), bulk silicon germanium (SiGe) and/or bulk III-V semiconductor wafer. Alternatively, substrate 602 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 602 may already have pre-built structures (not shown) such as transistors, diodes, isolation regions (e.g., shallow trench isolation (STI) regions), interconnects, wiring, etc.

According to an exemplary embodiment, word lines 502 are formed by first depositing an electrically conductive material onto substrate 602, and then using a lithography and etching process to pattern the material into the individual word lines 502 shown in FIG. 7. Suitable electrically conductive materials include, but are not limited to, tungsten (W), ruthenium (Ru), tantalum (TaN), and/or titanium nitride (TiN). For instance, a patterned insulating hardmask cap 604 is formed on the material marking the footprint and location of the individual word lines 502. Suitable electrically insulating hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). As will be described in detail below, insulating hardmask cap 604 prevents shorting between the word lines 502 and the bit lines 504.

Word lines 502 (i.e., WL1, WL2, . . . , WLn) can be formed along with the insulating hardmask cap 604 by any suitable patterning technique including, but not limited to, lithography followed by etching. Other suitable techniques, such as sidewall image transfer (SIT), self-aligned double patterning (SADP), self-aligned multiple patterning (SAMP), self-aligned quadruple patterning (SAQP) can also be used. Alternatively, the word lines 502 can be formed by using a damascene process, i.e., by forming trenches in a sacrificial material (not shown), filling the trenches with the electrically conductive material, recessing the electrically conductive material, forming the insulating hardmask cap 604 on top of the electrically conductive material, and then removing the sacrificial material. In one exemplary embodiment, the word lines 502 include tungsten and are formed by a directional (i.e., anisotropic) etching process such as reactive ion etching (RIE). In order to illustrate the patterned word lines 502 on substrate 602, only the outline of insulating hardmask cap 604 is shown in the top-down view of FIG. 7.

Figure 8:
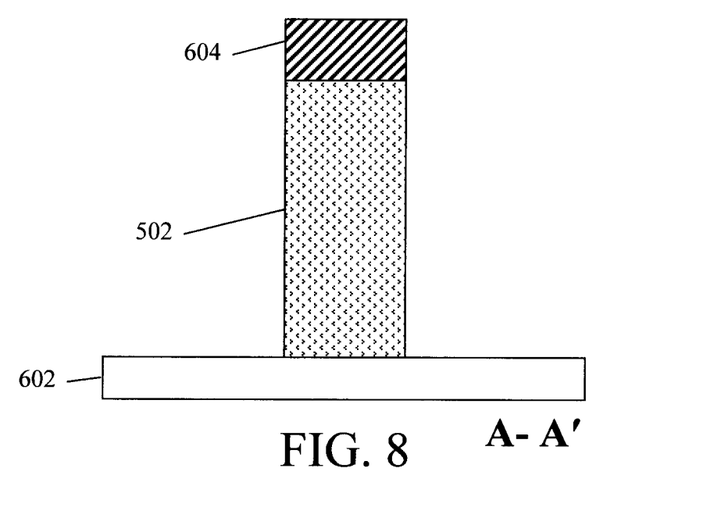
FIG. 8 is a cross-sectional diagram illustrating one of the word lines from FIG. 7 having the insulating hardmask cap disposed thereon according to an embodiment of the present invention.
Figure 9:
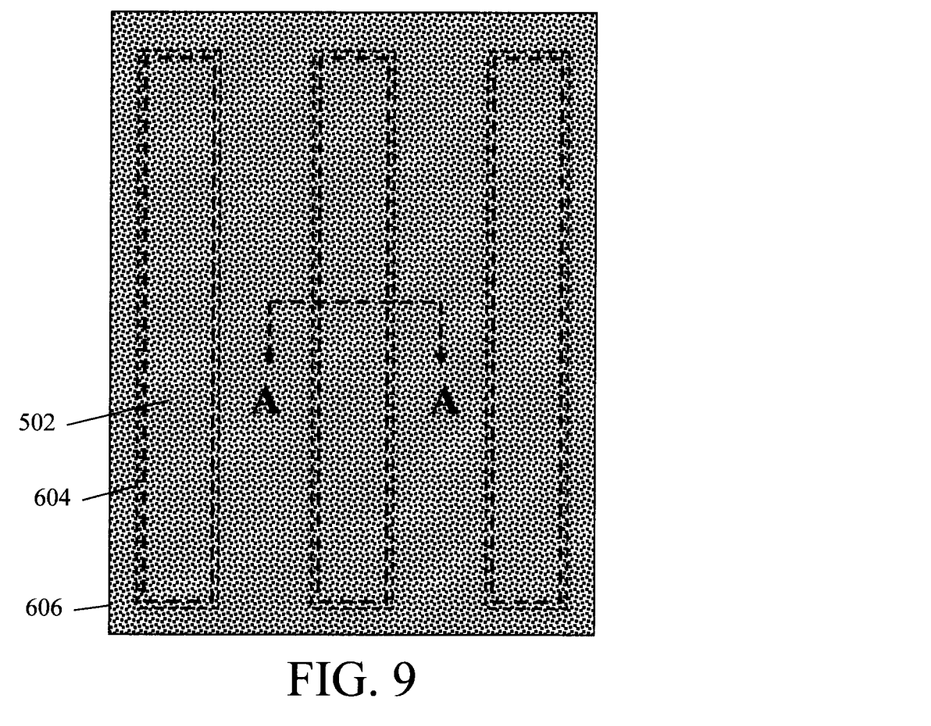
FIG. 9 is a top-down diagram illustrating a (e.g., non-conformal) layer of the PCM material having been deposited onto the substrate over the word lines and insulating hardmask cap according to an embodiment of the present invention.

Cross-sectional cuts of the device, e.g., along line A-A' (see FIG. 7), are also provided. For instance, the cross-sectional view in FIG. 8 illustrates insulating hardmask cap 604 disposed on one of the patterned word lines 502. As highlighted above, insulating hardmask cap 604 prevents shorting between the word lines 502 and bit lines 504.

Next, a layer of the PCM material 606 is deposited onto the substrate 602 over the word lines 502 and insulating hardmask cap 604. See the top-down view in FIG. 9. Suitable PCM materials 606 include, but are not limited to, a Ge—Sb—Te (germanium-antimony-tellurium or "GST") alloys, Si—Sb—Te (silicon-antimony-tellurium) alloys, Ga—Sb—Te (gallium-antimony-tellurium) alloys, Ge—Bi—Te (germanium-bismuth-tellurium) alloys, In—Te (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, and/or Si—Sb alloys. In some embodiments, the phase change material can further include nitrogen, carbon, and/or oxygen. In some embodiments, the phase change material can be doped with dielectric materials including, but not limited to, aluminum oxide ($Al_2O_3$), silicon oxide ($SiO_2$), (tantalum oxide ($Ta_2O_5$), hafnium oxide ($HfO_2$), zirconium oxide ($ZrO_2$), cerium oxide ($CeO_2$), silicon nitride (SiN), and/or silicon oxynitride (SiON).

In this embodiment, PCM material 606 is deposited as a non-conformal layer having a tapered thickness along the sidewalls of word line 502. See FIG. 10 (a cross-sectional view along line along line A-A'). Namely, as shown in FIG. 10, PCM material 606 has a thickness T1 at the bottom of word line 502 and gradually increases to a thickness T2 at the top of word line 502, i.e., wherein T2>T1.

Figure 10:
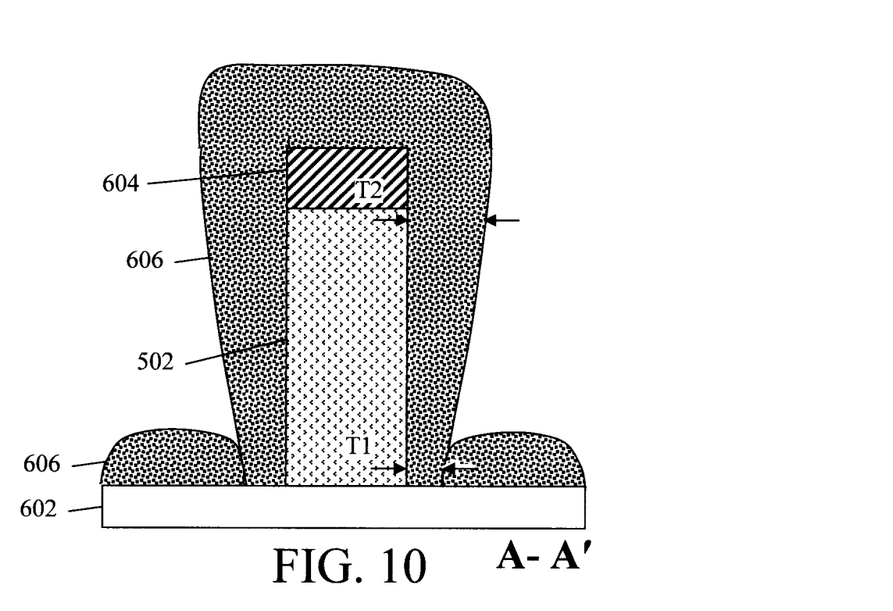
FIG. 10 is a cross-sectional diagram illustrating the non-conformal layer of the PCM material having a tapered thickness along the sidewalls of the word lines according to an embodiment of the present invention.

According to an exemplary embodiment, the non-conformal layer of PCM material 606 is deposited using a deposition process such as physical vapor deposition (PVD) or chemical vapor deposition performed at an angle to create the taper of PCM material 606 along the vertical sidewalls of word line 502 shown in FIG. 10. Substrate 602 is perpendicular to the vertical sidewalls of word line 502. Alternatively, an angled deposition process can be used to result in the build-up of PCM material 606 on substrate 602 at the foot of the word lines 502. See FIG. 10.

Figure 11:
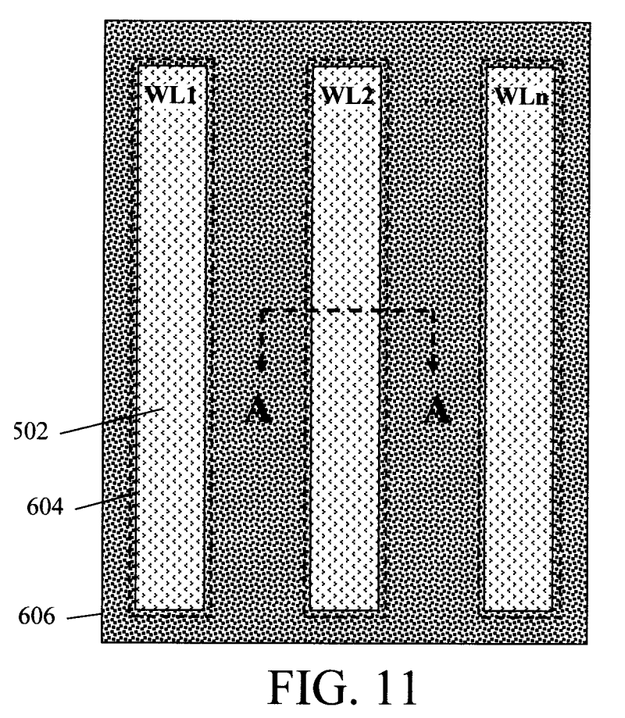
FIG. 11 is a top-down diagram illustrating an etch having been performed to remove the PCM material from horizontal surfaces including over the word lines/insulating hardmask cap according to an embodiment of the present invention.
Figure 12:
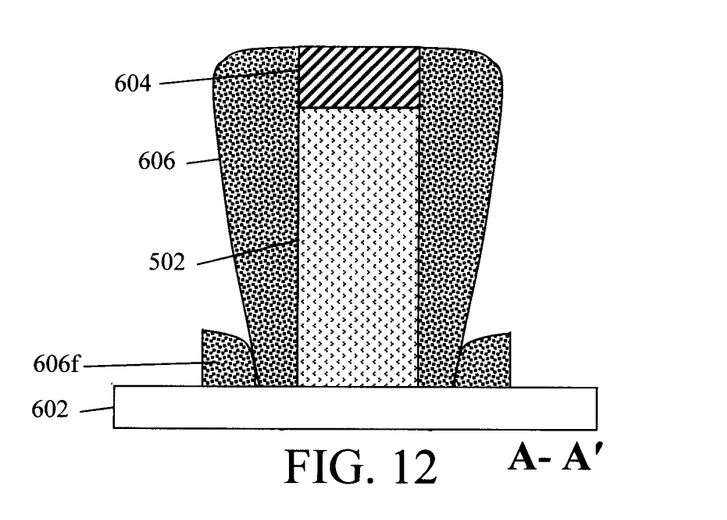
FIG. 12 is a cross-sectional diagram illustrating that the PCM material is removed from the top of word line/insulating hardmask cap according to an embodiment of the present invention.

An etch is then performed to remove the PCM material 606 from horizontal surfaces including over the word lines 502/insulating hardmask cap 604. See the top-down view in FIG. 11. As above, only the outline of insulating hardmask cap 604 is shown in FIG. 11 in order to illustrate the patterned word lines 502 on substrate 602. A directional (i.e., anisotropic) etching process such as reactive ion etch (RIE) can be used for the PCM material 606 etch. As shown in FIG. 12 (a cross-sectional view along line along line A-A'), PCM material 606 is now removed from the top of word line 502/insulating hardmask cap 604. Further, the directional etch will cut the PCM material 606 at the foot of the word lines 502. As shown in FIG. 12, the PCM material 606 along the vertical sidewalls of word line 502 overhangs a portion of the PCM material 606 at the foot of the word lines 502, thus preventing complete removal of the latter by the etch and resulting in PCM foot 606f around the bottom of the word lines 502. The lateral thickness of the PCM foot 606f is substantially the same as the width of PCM around the top of the insulating hardmask 604.

Figure 13:
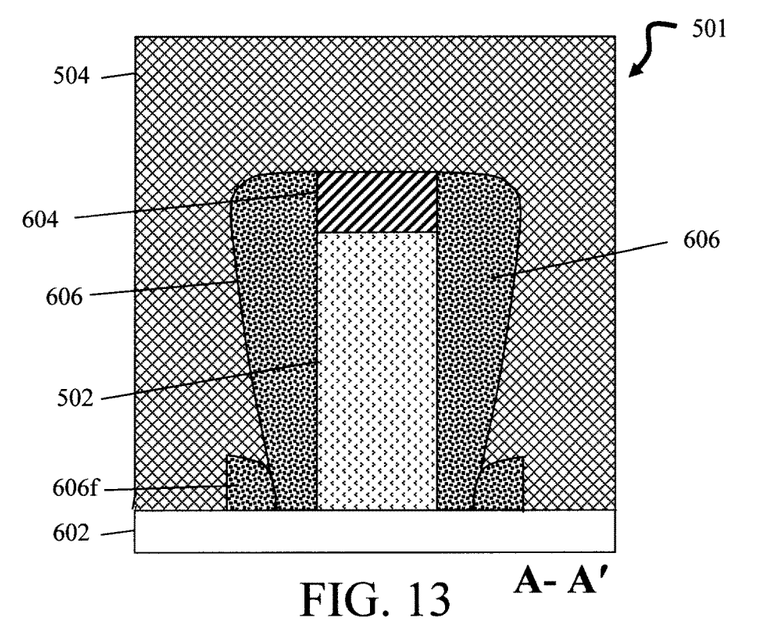
FIG. 13 is a cross-sectional diagram illustrating the bit lines having been formed over PCM material, insulating hardmask cap, and word lines whereby, due to the taper of PCM material along the sidewalls of the word lines, the PCM material has a thickness that varies gradually between the word lines and bit lines according to an embodiment of the present invention.

Bit lines 504 are then formed over PCM material 606, insulating hardmask cap 604, and word lines 502 to complete each PCM element 501. See FIG. 13 (a cross-sectional view along line along line A-A'). As shown in FIG. 13, due to the taper of PCM material 606 along the sidewalls of word lines 502, PCM material 606 has a thickness that varies gradually between word lines 502 and bit lines 504. Insulating hardmask cap 604 prevents direct contact between the tops of word lines 502 and the overlying bit lines 504.

According to an exemplary embodiment, bit lines 504 are formed by first depositing an electrically conductive material onto substrate 602 over PCM material 606 and word lines 502, and then using a lithography and etching process to pattern the material into the individual bit lines 504 as shown, for example, in the top-down view of FIG. 5 (described above). As provided above, suitable electrically conductive materials include, but are not limited to, W, Ru, TaN, and/or TiN. The electrically conductive material is then patterned to form bit lines 504 by using any suitable patterning technique including, but not limited to, lithography followed by etching. Other suitable techniques, such as SIT, SADP, SAMP, SAQP can also be used. Alternatively, the bit lines 504 can be formed by using a damascene process, i.e., by forming trenches in a sacrificial material (not shown), filling the trenches with the electrically conductive material, recessing the electrically conductive material, and then removing the sacrificial material. In one exemplary embodiment, the bit lines 504 include tungsten and formed by a directional (i.e., anisotropic) etching process such as RIE.

As patterned, bit lines 504 (e.g., BL1, BL2, . . . , BL*m*) are oriented orthogonal to word lines 502. The PCM material 606 forms a PCM element 501 at each intersection of word lines 502 and bit lines 504.

As highlighted above, non-conformal deposition of the PCM material is only one of the ways contemplated herein for creating a tapered PCM thickness between the word line and bit line. According to an alternative embodiment, conformal PCM deposition is employed followed by a directional etch to produce the taper.

This alternative embodiment begins in the same manner as the above example with the formation of word lines 502 (e.g., W, Ru, TaN and/or TiN) having an insulating hardmask cap 604 (e.g., SiN, SiON, SiCN, and/or SiOx) on substrate 602 (see FIG. 7 and FIG. 8). As such, like structures are numbered alike in the figures.

Figure 14:
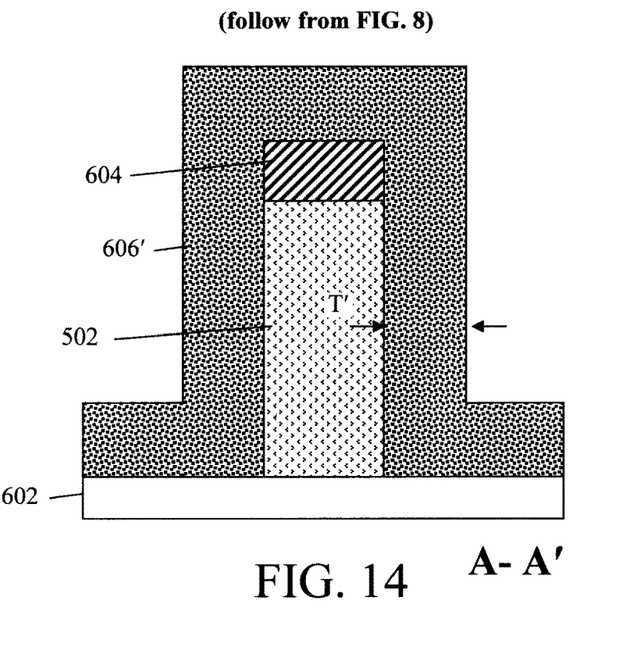
FIG. 14 is a cross-sectional diagram following from FIG. 8 which illustrates, according to an alternative embodiment, a conformal layer of PCM material having been deposited onto the substrate over the word lines and insulating hardmask cap according to an embodiment of the present invention.

However, as shown in FIG. 14 (which follows from FIG. 8), in this example a conformal layer of PCM material 606' is deposited onto the substrate 602 over the word lines 502 and insulating hardmask cap 604. As provided above, suitable PCM materials 606' include, but are not limited to, chalcogenide phase change materials such as GeTe, SbTe and/or GeSbTe. According to an exemplary embodiment, PCM material 606' is deposited using a process such as atomic layer deposition (ALD) or CVD. As a result, PCM material 606' as deposited has a substantially uniform thickness T'. See FIG. 14.

Figure 15:
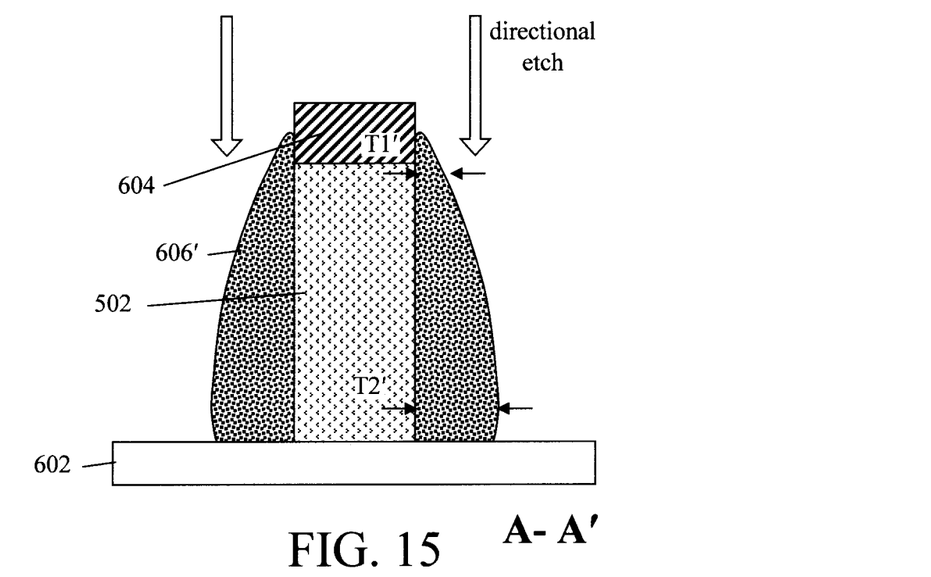
FIG. 15 is a cross-sectional diagram illustrating a directional etching process having been used to gradually taper the thickness of the PCM material along the sidewalls of the word lines according to an embodiment of the present invention.

Thus, in order to create the desired taper in the PCM material 606' thickness, a directional (i.e., anisotropic) etching process such as RIE is then used to gradually taper the thickness of PCM material 606' along the sidewalls of the word line 502. See FIG. 15. The tapered PCM material 606' resembles a sidewall spacer, and thus may also be referred to herein as a spacer-like PCM layer. As shown in FIG. 15, following the directional etch, PCM material 606' has a thickness T1' at the top of word line 502 and gradually increases to a thickness T2' at the bottom of word line 502, i.e., wherein T2'>T1'. Thus, in contrast to the previous example, here the reverse taper is created where the PCM is thicker at the bottom. With the non-conformal deposition process described above, the PCM is thicker at the top of the word line 502.

Figure 16:
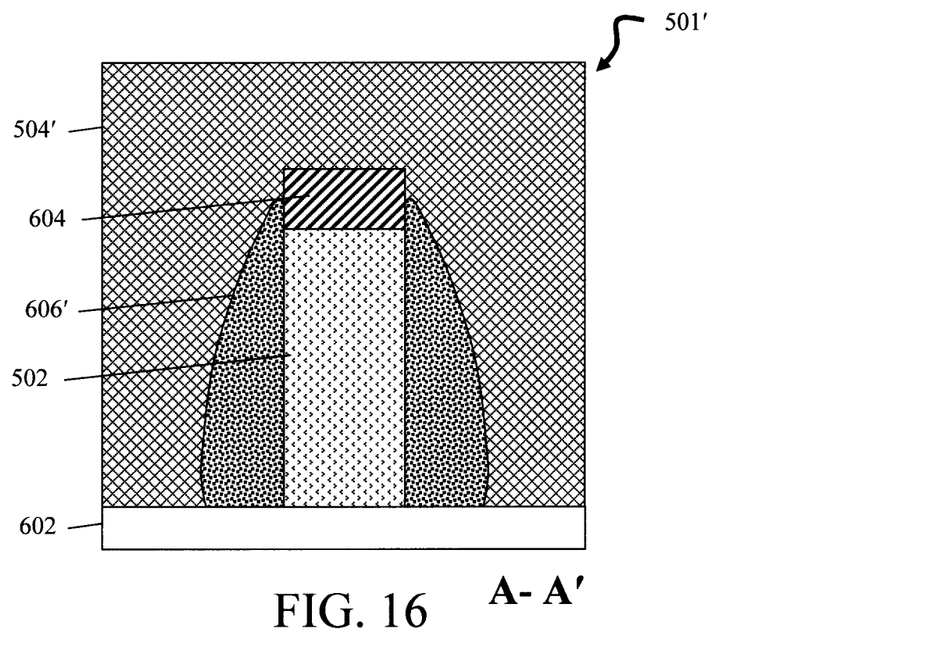
FIG. 16 is a cross-sectional diagram illustrating bit lines having been formed over PCM material, insulating hardmask cap, and word lines whereby, due to the taper of PCM material along the sidewalls of the word lines, the PCM material has a thickness that varies gradually between the word lines and bit lines according to an embodiment of the present invention.

Bit lines 504' are then formed over PCM material 606' and word lines 502 to complete each PCM element 501'. See FIG. 16. As shown in FIG. 16, due to the taper of PCM material 606' along the sidewalls of word lines 502, PCM material 606' has a thickness that varies gradually between word lines 502 and bit lines 504'. Insulating hardmask cap 604 prevents direct contact between the tops of word lines 502 and the overlying bit lines 504'.

According to an exemplary embodiment, bit lines 504' are formed by first depositing an electrically conductive material onto substrate 602 over PCM material 606' and word lines 502, and then using a lithography and etching process to pattern the material into the individual bit lines 504' as shown, for example, in the top-down view of FIG. 5 (described above). As provided above, suitable electrically conductive materials include, but are not limited to, W, Ru, TaN, and/or TiN. The electrically conductive material is then patterned to form bit lines 504' by using any suitable patterning technique including, but not limited to, lithography followed by etching. Other suitable techniques, such as SIT, SADP, SAMP, SAQP can also be used. Alternatively, the bit lines 504' can be formed by using a damascene process, i.e., by forming trenches in a sacrificial material (not shown), filling the trenches with the electrically conductive material, recessing the electrically conductive material, and then removing the sacrificial material. In one exemplary embodiment, the bit lines 504' include tungsten and formed by a directional (i.e., anisotropic) etching process such as RIE.

As patterned, bit lines 504' (e.g., BL1, BL2, . . . , BL*m*) are oriented orthogonal to word lines 502. The PCM material 606' forms a PCM element 501' at each intersection of word lines 502 and bit lines 504'.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a phase change memory (PCM) computing device, the method comprising the steps of:
    forming word lines on a substrate, the word lines having an insulating hardmask cap disposed thereon;
    forming a PCM material over the word lines, wherein the PCM material has a tapered thickness along sidewalls of the word lines; and
    forming bit lines over, and surrounding, the PCM material, the insulating hardmask cap, and the word lines, wherein the bit lines are oriented orthogonal to the word lines, and wherein the tapered thickness of the PCM material varies gradually between the word lines and the bit lines.

2. The method of claim 1, wherein the insulating hardmask cap prevents direct contact between the word lines and the bit lines.

3. The method of claim 1, wherein the insulating hardmask cap comprises a material selected from the group consisting of: silicon nitride (SiN), silicon oxynitride (SiON), silicon carbide nitride (SiCN), silicon oxide (SiOx), and combinations thereof.

4. The method of claim 1, wherein the PCM material is selected from the group consisting of: germanium-antimony-tellurium (Ge—Sb—Te) alloys, silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Te) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, and combinations thereof.

5. The method of claim 1, further comprising the step of:
depositing a non-conformal layer of the PCM material onto the substrate over the word lines and the insulating hardmask cap to form the PCM material having the tapered thickness along the sidewalls of the word lines.

6. The method of claim 5, further comprising the step of:
removing the PCM material over the insulating hardmask cap.

7. The method of claim 5, wherein the non-conformal layer of the PCM material has a thickness T1 at a bottom of the word lines and gradually increases to a thickness T2 at a top of the word lines, wherein T2>T1.

8. The method of claim 1, further comprising the steps of:
depositing a conformal layer of the PCM material onto the substrate over the word lines and the insulating hardmask cap; and
tapering the PCM material along sidewalls of the word lines using a directional etch.

9. The method of claim 8, wherein the PCM material, as tapered, has a thickness T1' at a top of the word lines and gradually increases to a thickness T2' at a bottom of the word lines, wherein T2'>T1'.

10. A method of forming a PCM computing device, the method comprising the steps of:
forming word lines on a substrate, the word lines having an insulating hardmask cap disposed thereon;
depositing a non-conformal layer of a PCM material onto the substrate over the word lines and the insulating hardmask cap having a tapered thickness along sidewalls of the word lines;
removing the PCM material over the insulating hardmask cap; and
forming bit lines over, and surrounding, the PCM material, the insulating hardmask cap, and the word lines, wherein the bit lines are oriented orthogonal to the word lines, and wherein the tapered thickness of the PCM material varies gradually between the word lines and the bit lines.

11. The method of claim 10, wherein the insulating hardmask cap prevents direct contact between the word lines and the bit lines.

12. The method of claim 10, wherein the PCM material is selected from the group consisting of: Ge—Sb—Te alloys, Si—Sb—Te alloys, Ga—Sb—Te alloys, Ge—Bi—Te alloys, In—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

13. The method of claim 10, wherein the non-conformal layer of the PCM material has a thickness T1 at a bottom of the word lines and gradually increases to a thickness T2 at a top of the word lines, wherein T2>T1.

14. A method of forming a PCM computing device, the method comprising the steps of:
forming word lines on a substrate, the word lines having an insulating hardmask cap disposed thereon;
depositing a conformal layer of a PCM material onto the substrate over the word lines and the insulating hardmask cap;
tapering the PCM material along sidewalls of the word lines using a directional etch such that the PCM material has a tapered thickness along sidewalls of the word lines; and
forming bit lines over, and surrounding, the PCM material, the insulating hardmask cap, and the word lines, wherein the bit lines are oriented orthogonal to the word lines, and wherein the tapered thickness of the PCM material varies gradually between the word lines and the bit lines.

15. The method of claim 14, wherein the insulating hardmask cap prevents direct contact between the word lines and the bit lines.

16. The method of claim 14, wherein the PCM material is selected from the group consisting of: Ge—Sb—Te alloys, Si—Sb—Te alloys, Ga—Sb—Te alloys, Ge—Bi—Te alloys, In—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

17. The method of claim 14, wherein the PCM material, as tapered, has a thickness T1' at a top of the word lines and gradually increases to a thickness T2' at a bottom of the word lines, wherein T2'>T1'.

18. A PCM device, comprising:
a substrate;
word lines disposed on the substrate;
an insulating hardmask cap disposed on the word lines;
a PCM material disposed over the word lines, wherein the PCM material has a tapered thickness along sidewalls of the word lines; and
bit lines disposed over, and surrounding, the PCM material, the insulating hardmask cap, and the word lines, wherein the bit lines are oriented orthogonal to the word lines, and wherein the tapered thickness of the PCM material varies gradually between the word lines and the bit lines.

19. The PCM device of claim 18, wherein the insulating hardmask cap prevents direct contact between the word lines and the bit lines.

20. The PCM device of claim 18, wherein the PCM material is selected from the group consisting of: Ge—Sb—Te alloys, Si—Sb—Te alloys, Ga—Sb—Te alloys, Ge—Bi—Te alloys, In—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

21. The PCM device of claim 18, wherein the PCM material has a thickness T1 at a bottom of the word lines and gradually increases to a thickness T2 at a top of the word lines, wherein T2>T1.

22. The PCM device of claim 18, wherein the PCM material has a thickness T1' at a top of the word lines and gradually increases to a thickness T2' at a bottom of the word lines, wherein T2'>T1'.

* * * * *